United States Patent
Wiser et al.

(10) Patent No.: US 9,974,050 B2
(45) Date of Patent: May 15, 2018

(54) TRANSMITTER IC FOR SINGLE-CHANNEL BLUETOOTH BEACON

(71) Applicant: Verily Life Sciences LLC, Mountain View, CA (US)

(72) Inventors: Robert Francis Wiser, San Francisco, CA (US); Nathan Pletcher, Mountain View, CA (US); William James Biederman, Fox Island, WA (US); Daniel James Yeager, Berkeley, CA (US); Brian Otis, Saratoga, CA (US); Francis Albert Honore, San Francisco, CA (US); Kannan Aryaperumal Sankaragomathi, Seattle, WA (US)

(73) Assignee: Verily Life Sciences LLC, Mountain View, CA (US)

(*) Notice: Subject to any disclaimer, the term of this patent is extended or adjusted under 35 U.S.C. 154(b) by 77 days.

(21) Appl. No.: 14/971,734

(22) Filed: Dec. 16, 2015

(65) Prior Publication Data

US 2017/0181125 A1 Jun. 22, 2017

(51) Int. Cl.
*H04W 72/00* (2009.01)
*H04W 4/00* (2018.01)
(Continued)

(52) U.S. Cl.
CPC ...... *H04W 72/005* (2013.01); *G06Q 30/0241* (2013.01); *H03F 1/02* (2013.01);
(Continued)

(58) Field of Classification Search
CPC .............. H04W 72/005; H04W 4/008; H04W 52/0229; H04W 52/00; H04W 52/02;
(Continued)

(56) References Cited

U.S. PATENT DOCUMENTS

| 7,098,573 | B2 | 8/2006 | Stommer |
| 7,215,214 | B1 | 5/2007 | Taheri et al. |

(Continued)

FOREIGN PATENT DOCUMENTS

| EP | 2800341 A1 | 11/2014 |
| KR | 2006083761 A | 7/2006 |

OTHER PUBLICATIONS

International Search Report dated Mar. 29, 2017 issued in connection with International Application No. PCT/US2016/066296, filed on Dec. 13, 2016, 5 pages.

(Continued)

*Primary Examiner* — Brian O'Connor
(74) *Attorney, Agent, or Firm* — McDonnell Boehnen Hulbert & Berghoff LLP

(57) ABSTRACT

Methods and systems described herein relate to broadcasting an advertisement event on a wireless channel. An example method includes generating, based on data, a data signal including one or more data packets, where each of the one or more data packets is a non-connectable and non-scannable data packet; generating an RF signal using an oscillator circuit; directly modulating the RF signal, based on the data signal, to generate a modulated RF signal; amplifying the modulated RF signal; broadcasting the amplified modulated RF signal on the wireless channel, where the amplified modulated RF signal is associated with the advertisement event.

19 Claims, 6 Drawing Sheets

(51) Int. Cl.
*H04L 27/12* (2006.01)
*G06Q 30/02* (2012.01)
*H04B 1/04* (2006.01)
*H03F 1/02* (2006.01)
*H03F 3/24* (2006.01)
*H04R 25/00* (2006.01)
*H04W 52/02* (2009.01)
*H04W 52/00* (2009.01)

(52) U.S. Cl.
CPC ............... *H03F 3/24* (2013.01); *H04B 1/04* (2013.01); *H04L 27/12* (2013.01); *H04W 4/008* (2013.01); *H04W 4/80* (2018.02); *H04W 52/0216* (2013.01); *H04W 52/0219* (2013.01); *H04B 2001/045* (2013.01); *H04R 25/305* (2013.01); *H04W 52/00* (2013.01); *H04W 52/02* (2013.01); *H04W 52/0229* (2013.01); *Y02B 60/50* (2013.01); *Y02D 70/00* (2018.01)

(58) Field of Classification Search
CPC ............ H04W 8/005; H04W 52/0216; H04W 52/0274; H04W 12/06; G06Q 30/0241; H04L 27/12; Y02B 60/50; H04R 25/305; H04J 7/007; H02J 7/025
See application file for complete search history.

(56) References Cited

U.S. PATENT DOCUMENTS

| | | | |
|---|---|---|---|
| 9,276,556 B1 | 3/2016 | Wu et al. | |
| 9,407,106 B2* | 8/2016 | Redding | H02J 5/005 |
| 9,408,147 B2* | 8/2016 | Polo | H04W 52/0229 |
| 9,431,844 B2* | 8/2016 | Redding | H02J 5/005 |
| 9,497,553 B2* | 11/2016 | Solum | H04R 25/554 |
| 9,706,496 B2* | 7/2017 | Polo | H04W 52/0274 |
| 2003/0224747 A1 | 12/2003 | Anand et al. | |
| 2004/0130405 A1 | 7/2004 | Mohan et al. | |
| 2005/0245001 A1 | 11/2005 | Hyvonen et al. | |
| 2007/0296513 A1 | 12/2007 | Ruile et al. | |
| 2010/0302979 A1 | 12/2010 | Reunamaki | |
| 2010/0315138 A1 | 12/2010 | Namba et al. | |
| 2012/0075026 A1 | 3/2012 | Ruby et al. | |
| 2012/0195239 A1 | 8/2012 | Belitzer et al. | |
| 2012/0196534 A1 | 8/2012 | Kasslin et al. | |
| 2013/0003630 A1 | 1/2013 | Xhafa et al. | |
| 2013/0165044 A1 | 6/2013 | Xie et al. | |
| 2013/0254574 A1* | 9/2013 | Zacchio | G06F 1/3234 713/323 |
| 2013/0342285 A1 | 12/2013 | Kadota et al. | |
| 2014/0055243 A1 | 2/2014 | Kerai | |
| 2014/0086125 A1* | 3/2014 | Polo | H04W 52/0229 370/311 |
| 2014/0254466 A1 | 9/2014 | Wurster et al. | |
| 2014/0321321 A1 | 10/2014 | Knaappila | |
| 2015/0011428 A1 | 1/2015 | Cable et al. | |
| 2015/0021721 A1 | 1/2015 | Romig et al. | |
| 2015/0087255 A1* | 3/2015 | Wentzloff | H04B 1/1027 455/296 |
| 2015/0141772 A1* | 5/2015 | LeBoeuf | A61B 5/486 600/301 |
| 2015/0188491 A1 | 7/2015 | Pancholi et al. | |
| 2015/0330869 A1 | 11/2015 | Ziarno | |
| 2015/0332258 A1 | 11/2015 | Kurabi et al. | |
| 2016/0021686 A1 | 1/2016 | Kang et al. | |
| 2016/0029148 A1 | 1/2016 | Jackson et al. | |
| 2016/0099701 A1 | 4/2016 | Rinaldi et al. | |
| 2016/0105761 A1 | 4/2016 | Polo et al. | |
| 2016/0254844 A1 | 9/2016 | Hull et al. | |
| 2017/0346516 A1 | 11/2017 | Ripley et al. | |

OTHER PUBLICATIONS

Written Opinion of the International Searching Authority dated Mar. 29, 2017 issued in connection with International Application No. PCT/US2016/066296, filed on Dec. 13, 2016, 10 pages.
nRF8001 Product Specification 1.3—Nordic Semiconductor https://www.nordicsemi.com/kor/content/download/2981/38488/file/nRF8001_PS_v1.3.pdf last accessed Apr. 23, 2017, 217 pages.
Hu, Julie R. et al., "A 1.56 GHz Wide-Tuning All Digital FBAR-Based PLL in 0.13 um CMOS", Department of Electrical Engineering, University of Washington, Seattle, Washington (2010), pp. 1-4.
Sankaragomathi, Kannan A., "A +/− 3ppm 1.1mW FBAR Frequency Reference with 750 MHz Output and 750mV Supply" University of Washington, Seattle, 3 pages.
Thirunarayanan, Raghavasimhan, "Reducing Energy Dissipation in ULP Systems: PLL-Free FBAR-Based Fast Startup Transmitters", IEEE Transactions on Microwave Theory and Techniques, vol. 63, No. 4, Apr. 2015, pp. 1110-1117.
Nelson, Andrew et al. "A 22 µW, 2.0GHz FBAR oscillator" IEEE Radio Frequency Integrated Circuits Symposium (2011), pp. 1-4.
Paidimarri, Arun et al. "A 2.4 GHz Multi-Channel FBAR-Based Transmitter With an Integrated Pulse-Shaping Power Amplifier." IEEE Journal of Solid-State Circuits (2013), vol. 48(4), pp. 1042-1054.
Otis, Brian Patrick "Ultra-low power wireless technologies for senor networks" Ph.D. Thesis, University of California, Berkeley(Spring, 2005), 181 pages.
Paidimarri, Arun "Architecture for ultra-low power multi-channel transmitters for body area networks using RF resonators" Massachusetts Institute of Technology (Jun. 2011), pp. 1-103.
Chee, Y.H. et al. "An ultra-low power injection locked transmitter for wireless sensor networks" IEE Custom Integrated Circuits Conference (2005), pp. 797-800.
Chee, Y.H. et al. "Ultra low power transmitters for wireless sensor networks" Electrical Engineering and Computer Sciences University of California at Berkeley (May 15, 2006), 140 pages.
Otis, B.P. et al., "An ultra-low power MEMS-based two-channel transceiver for wireless sensor networks" Department of Electrical Engineering and Computer Science University of California, Berkeley (2004), pp. 1-4.
Written Opinion of the International Searching Authority dated Jun. 23, 2017 issued in connection with International Application No. PCT/US2017/029164, filed on Apr. 24, 2017, 9 pages.
International Search Report dated Jun. 23, 2017 issued in connection with International Application No. PCT/US2017/029164, filed on Apr. 24, 2017, 4 pages.
Written Opinion of the International Searching Authority dated May 19, 2017 issued in connection with International Application No. PCT/US2017/021423, filed on Mar. 8, 2017,9 pages.
International Search Report dated May 19, 2017 issued in connection with International Application No. PCT/US2017/021423, filed on Mar. 8, 2017,4 pages.

* cited by examiner

TRANSMITTER IC FOR SINGLE-CHANNEL BLUETOOTH BEACON

BACKGROUND

Unless otherwise indicated herein, the materials described in this section are not prior art to the claims in this application and are not admitted to be prior art by inclusion in this section.

Portable computing devices such as personal computers, laptop computers, tablet computers, smart phones, wearable computers, and countless types of Internet-capable devices are prevalent in numerous aspects of modern life. For example, it is common for a single consumer to operate a smart phone, a laptop computer, a keyboard, and a mouse, possibly simultaneously. With increasing consumers of multiple portable devices, the demand for wireless technology continues to play a role in the use of such portable devices. As such, various forms of wireless technology have evolved to locally connect these portable devices for numerous applications. One wireless technology standard for exchanging data between multiple portable devices is popularly known as Bluetooth.

Bluetooth is commonly used for wirelessly connecting a portable device with one or more other portable devices over a short range. For example, Bluetooth may be used to connect a cell phone to a wireless headset, possibly allowing for hands-free use of the phone. In some instances, Bluetooth may also be used to connect the cell phone to the audio speakers and a microphone of a motor vehicle, possibly allowing for hands-free use of the phone while operating the vehicle. Thus, numerous applications have allowed Bluetooth to grow as the standard wire-replacement protocol. In multiple applications, Bluetooth remains particularly attractive due to its low-cost solutions and protocols designed for low power consumption.

SUMMARY

Example embodiments herein disclose systems and methods capable of providing a signal via a Bluetooth low energy device. By using a Bluetooth low energy device to transmit a signal, significant power savings can be achieved.

In one example, a method of broadcasting an advertisement event on a wireless channel is provided. The method includes generating, based on data, a data signal including one or more data packets, where each of the one or more data packets is a non-connectable and non-scannable data packet; generating an RF signal using an oscillator circuit; directly modulating the RF signal, based on the data signal, to generate a modulated RF signal; amplifying the modulated RF signal; broadcasting the amplified modulated RF signal on the wireless channel, where the amplified modulated RF signal is associated with the advertisement event.

In another example, a broadcasting device is provided. The broadcasting device includes a packetizer configured to generate, based on data, a data signal including one or more data packets, where each of the one or more data packets is a non-connectable data packet; an oscillator configured to generate an RF signal, where the RF signal is directly modulated based on the data signal to generate a modulated RF signal; a power amplifier configured to amplify the modulated RF signal; and an antenna configured to broadcast the amplified modulated RF signal in a wireless channel as an advertisement event.

In yet another example, a system is provided. The system may include one or more one or more processors; a packetizer configured to: receive data from the one or more processors, generate, based on the data, a data signal comprising one or more data packets, where each of the one or more data packets is a non-connectable data packet; an oscillator, comprising an FBAR resonator, configured to generate an RF signal, where the RF signal is directly modulated based on the data signal to generate a modulated RF signal; a power amplifier configured to amplify the modulated RF signal; and an antenna configured to broadcast the amplified modulated RF signal in a wireless channel as an advertisement event.

These as well as other aspects, advantages, and alternatives, will become apparent to those of ordinary skill in the art by reading the following detailed description, with reference where appropriate to the accompanying figures.

DETAILED DESCRIPTION

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

I. Overview

As noted, Bluetooth continues to grow as the standard wire-replacement protocol, and remains particularly attractive due to its protocols designed for low power consumption. Specifically, Bluetooth Low Energy (BLE), an extension of Bluetooth technology, may be attractive in applications where low power consumption may be advantageous.

In particular, BLE provides protocols for low power devices to communicate with multiple other devices. For example, consider a device that can be powered by one or more batteries. Further, consider that the device may be used in an application where replacing or recharging the one or more batteries may not be easily achievable. Accordingly, the device may be a low power device to preserve the charge of its power source. As such, the device may utilize BLE's protocols for communicating with other devices such as computing devices (i.e. phones, laptops, and wearable computing devices). In an example, the low power device, e.g. a sensor, may utilize BLE protocols to transmit data to a computing device.

Figure 1:
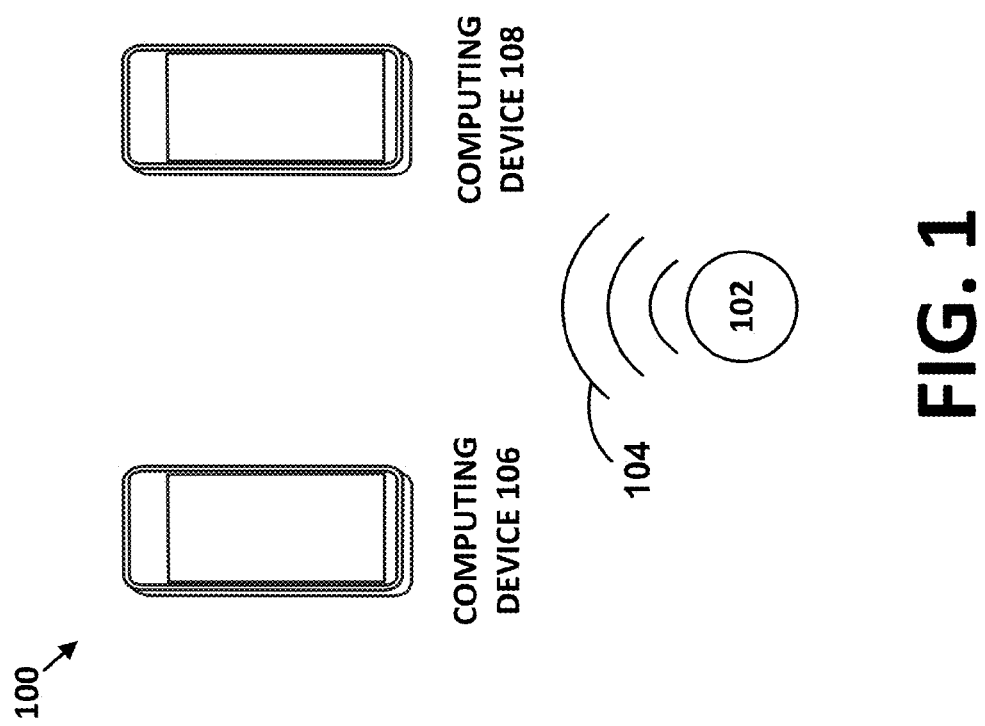
FIG. 1 illustrates computing devices located in proximity to a Bluetooth device, in accordance with an example embodiment.

FIG. 1 illustrates an example scenario 100 of a device utilizing BLE protocols. The BLE protocols may be carried out by a low power device 102, such as a sensor. More specifically, the low power device 102 may include a BLE device, which may transmit a signal 104 according to BLE protocols. The power source of the BLE device may be one or more batteries. In some examples, the one or more batteries may be the one or more batteries of the device 102 that the BLE device is incorporated in. Further, the BLE device may transmit, according to BLE protocols, the signal 104 to the computing devices 106 and 108. However, it should be understood that the arrangement for the BLE device provided in FIG. 1 is for purposes of illustration only. For example, the BLE device may be included in any device such as a phone (i.e. computing device), a digital television, a monitor, a tablet computer, wearable computing devices, and/or a human-interface device, among other possibilities. Further, in some embodiments, the BLE device may transmit a signal 104 to more than or less than two computing devices.

In scenario 100, each of the computing devices 106 and 108 may include a Bluetooth module, which may perform a Bluetooth scan to search for other Bluetooth devices and/or for signals from Bluetooth devices. In some embodiments, the computing devices 106 and 108 may scan for Bluetooth devices in order to pair with a Bluetooth device that is within a range of the Bluetooth scan of the computing devices. In other embodiments, at least one of the computing devices 106 and 108 may receive a signal from a Bluetooth device without pairing with the Bluetooth device. For example, at least one of the computing devices may receive a Bluetooth signal, e.g. signal 104, from the device 102 without pairing with the device 102.

Furthermore, scenario 100 may be a scenario where low power consumption by the BLE device is desirable. For example, the power source of the BLE device may a have limited charge. In such a scenario, low power consumption by the BLE device may be desirable to extend the life of the power source. Typically, the power consumption of the BLE device may be governed by at least the configuration of the BLE device and/or the hardware of the BLE device. Accordingly, the BLE device may be described in relation to at least decreasing its power consumption.

II. Example Systems and Methods

Figure 2:
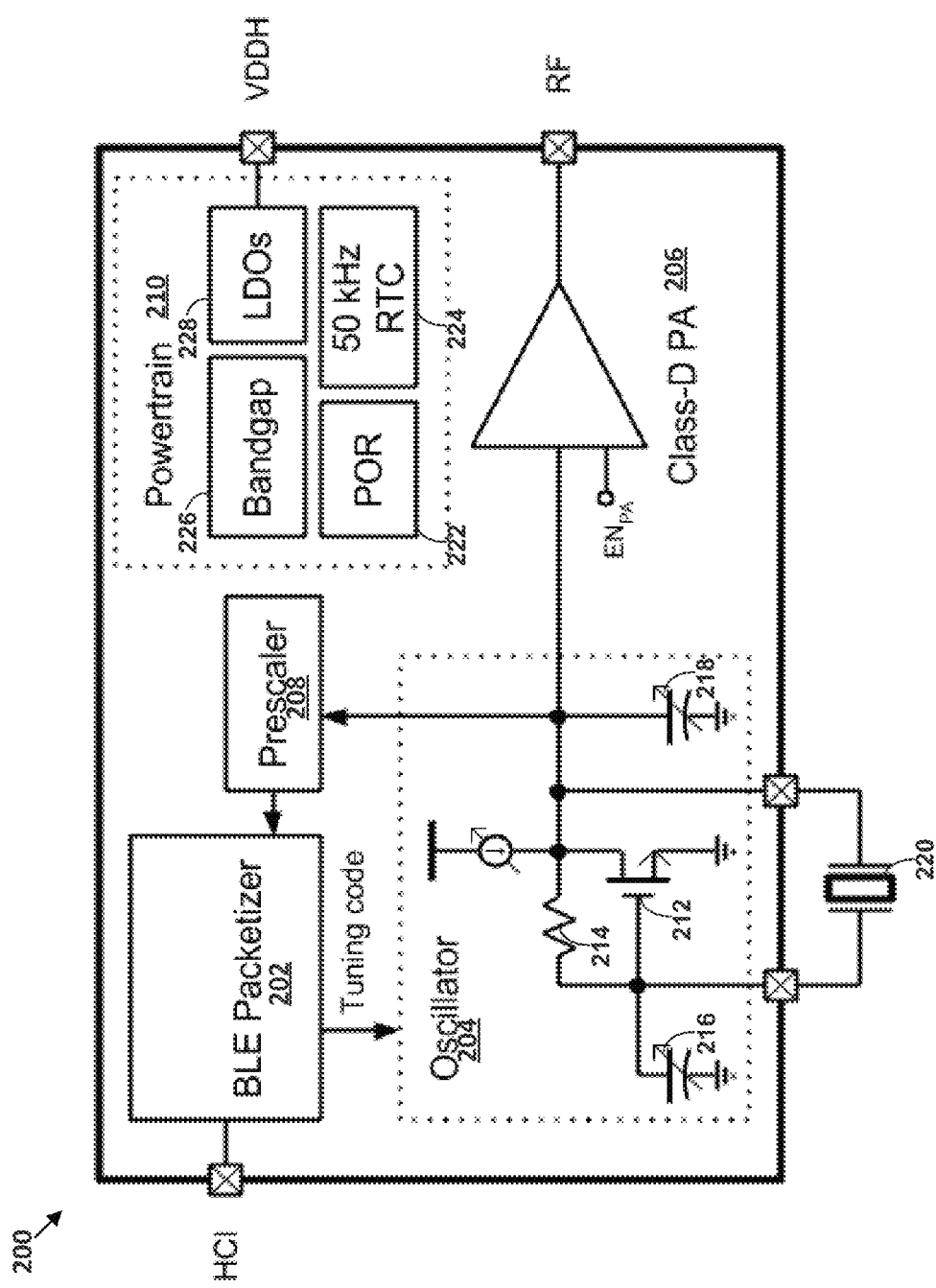
FIG. 2 is a schematic diagram of a Bluetooth device, in accordance with an example embodiment.

FIG. 2 schematically illustrates a BLE device 200, according to an example embodiment. In some embodiments, the BLE device 200 may be included in other devices as a Bluetooth module. For instance, the BLE device 200 may be included in device 102 in scenario 100. Accordingly, the BLE device 200 may receive instructions from a processor and/or a memory of the device that it was included in. For instance, the BLE device 200 may interface with the processor of its host device via a Host Controller Interface (HCI). The BLE device 200 may receive a signal via the HCI, which may include data that may be transmitted by the BLE device 200.

As illustrated in FIG. 2, the BLE device 200 may include a BLE packetizer 202, an oscillator 204, a powertrain 210, and an amplifier 206. These components, as described herein, may be used to transmit a signal 104 from the BLE device 200. However, the BLE device 200 may not be enabled to receive a signal from another device. Thus, in some embodiments, the BLE device 200 may not be able to pair with or receive signals from other Bluetooth devices. Accordingly, the BLE device 200 may operate as solely as a transmitter (also referred to herein as a "broadcaster" or as a "beacon"). For instance, in scenario 100, the BLE device may transmit a signal that may be received by the computing devices 106 and 108, without pairing with the computing devices.

Nonetheless, by eliminating at least some of the hardware that may be used to receive a signal, the power consumption of the BLE device 200 may be decreased. Additionally, eliminating at least some of the components for receiving a signal may decrease the manufacturing costs of the BLE device 200. Furthermore, the size of the BLE device 200 may be decreased, which may increase the potential applications and uses of the BLE device 200.

Returning to FIG. 2, the BLE packetizer 202 may receive a signal via the HCI. As explained elsewhere herein, the signal may originate from a processor of a device, which may be using the BLE device 200 as a Bluetooth module. Further, the signal that the BLE packetizer 202 may receive may include data, which may be included in the signal transmitted by the BLE device 200. The received signal may also include instructions indicative of the configuration of the BLE device 200, as the BLE device 200 transmits a signal. For example, the signal received may include parameters such as encryption parameters, modulation parameters, a mode of operation of the BLE device 200, packet type etc. Further, the parameters may be used to configure the BLE device 200 to generate a specific signal, which may be transmitted by the BLE device 200.

For instance, the signal received via the HCI may be indicative of a mode of operation of the BLE device 200. Within examples, the mode of operation may depend on the functionality of the BLE device 200. In some embodiments, the functionality of a BLE device 200 may be predetermined, as the BLE device 200 may be used in a specific application. In other instances, a user may provide an input indicative of the mode of operation to a computing device that may be using the BLE device 200 as its Bluetooth module. In particular, the user may provide an input to an input/output function of the computing device, possibly a graphical user-interface (GUI), to determine the mode of operation.

In some embodiments, the modes of operation of the BLE device 200 may include an advertising mode in which a BLE advertising protocol is used to periodically transmit data packets referred to as advertising packets (also referred to herein as "advertisement packets"). The advertising packets may carry data indicative of the BLE device 200 (i.e. a unique identification number (UID)). Alternatively or additionally, advertising packets may carry data indicative of or information from a device that may include the BLE device 200 as Bluetooth module. For example, the host device may use advertising packets to "advertise", possibly to "pair" or connect with another device.

In other examples, the BLE device 200 may use advertising packets to advertise data, which may have been stored in a memory of its host device, such as geographical data. In an example, the device 102 may be used in scenario 100 as a location beacon. Thus, the device 102 may use the BLE device 200 to transmit a signal that may provide one of the computing devices with precise geographical information included in advertising packets. In yet other examples, the BLE device 200 may be used to transmit advertising packets, which may include data that may have been collected by the BLE device 200's host device. For example, the advertising packets may include meteorological data gathered by a sensor. Accordingly, the broadcasted advertising packets may be received by a computing device (possibly referred to herein as a "receiver") within a range of the BLE device 200.

Furthermore, in some instances, the mode of operation of the BLE device 200 may affect its power consumption. For example, the BLE device 200 may its decrease power consumption by using advertising protocols, as advertising protocols may maintain the BLE device 200's low power consumption by periodically broadcasting a signal during certain time intervals. During time intervals where the BLE device 200 is not broadcasting a signal, the BLE device 102 200 idle or turn-off in a standby mode. Accordingly, by turning on only when transmitting a signal in an active transmit mode, the BLE device 200 may decrease its power consumption, which may be advantageous for devices with a finite power source. As such, advertising protocols are designed to allow the BLE device 200 to advertise data to one or more computing devices while maintaining the BLE device 200's low power consumption.

Furthermore, BLE's protocols include different types of advertising packets. The advertising packet type may at least specify a configuration of the BLE device 200. For instance, the advertising packet type may specify whether the BLE device 200 is connectable and/or scannable. A connectable BLE device may pair with another Bluetooth device, and a scannable BLE device may broadcast an advertising packet in response to receiving a scan request from another Bluetooth device. Furthermore, an advertising packet may be a directed packet. A directed packet may include the BLE's address and the receiver device's address, whereas an undirected packet may not be directed toward a particular receiver.

Accordingly, the configuration of the BLE device 200, which may be specified by the advertising packet type, may also affect the power consumption of the BLE device 200. For instance, a BLE device in a connectable and scannable configuration may use more power than a BLE device in a non-connectable and non-scannable configuration, as the BLE device in connectable and scannable configuration has a longer active transmit time than the BLE device operating in the non-connectable and non-scannable configuration.

As explained above, the BLE device 200 may operate only as a transmitter and therefore may not be able to operate in a connectable configuration. Furthermore, the transmitter may not be able to receive scan requests from other Bluetooth devices. Accordingly, in some embodiments, the BLE device 200 may be operating in a non-connectable and non-scannable configuration in order to decrease power consumption.

Note that there are other advantages to BLE's advertising protocols in addition to low power consumption of a BLE device operating using the advertising protocols. For example, in scenario 100, the computing devices 106 and 108 may discover Bluetooth devices located near the computing device faster (and consuming less energy) using advertising protocols than by using other protocols. Advertising protocols may use three fixed channels of a wireless spectrum, e.g., the 2.4 GHz wireless spectrum. Thus, by not scanning the full wireless spectrum, the computing devices 106 and 108 may detect other Bluetooth devices over the three fixed channels, allowing for receiving and sending BLE advertisement packets faster than the other protocols.

Returning to FIG. 2, the BLE packetizer 202 may use the data included in the signal received via the HCI to generate a data signal, which may include one or more data packets. Accordingly, the BLE packetizer 202 may receive instructions to generate a data signal including one or more data packets according to the advertising protocol. Further, the instructions may detail the type of advertising event to broadcast. For instance, as explained above, the type of advertising event may determine whether the device is connectable and/or scannable, and/or whether the packet is directed. In an example, the BLE packetizer 202 may receive data indicative of instructions to generate a data signal that includes a non-connectable, non-scannable, and undirected advertising event.

Figure 3:
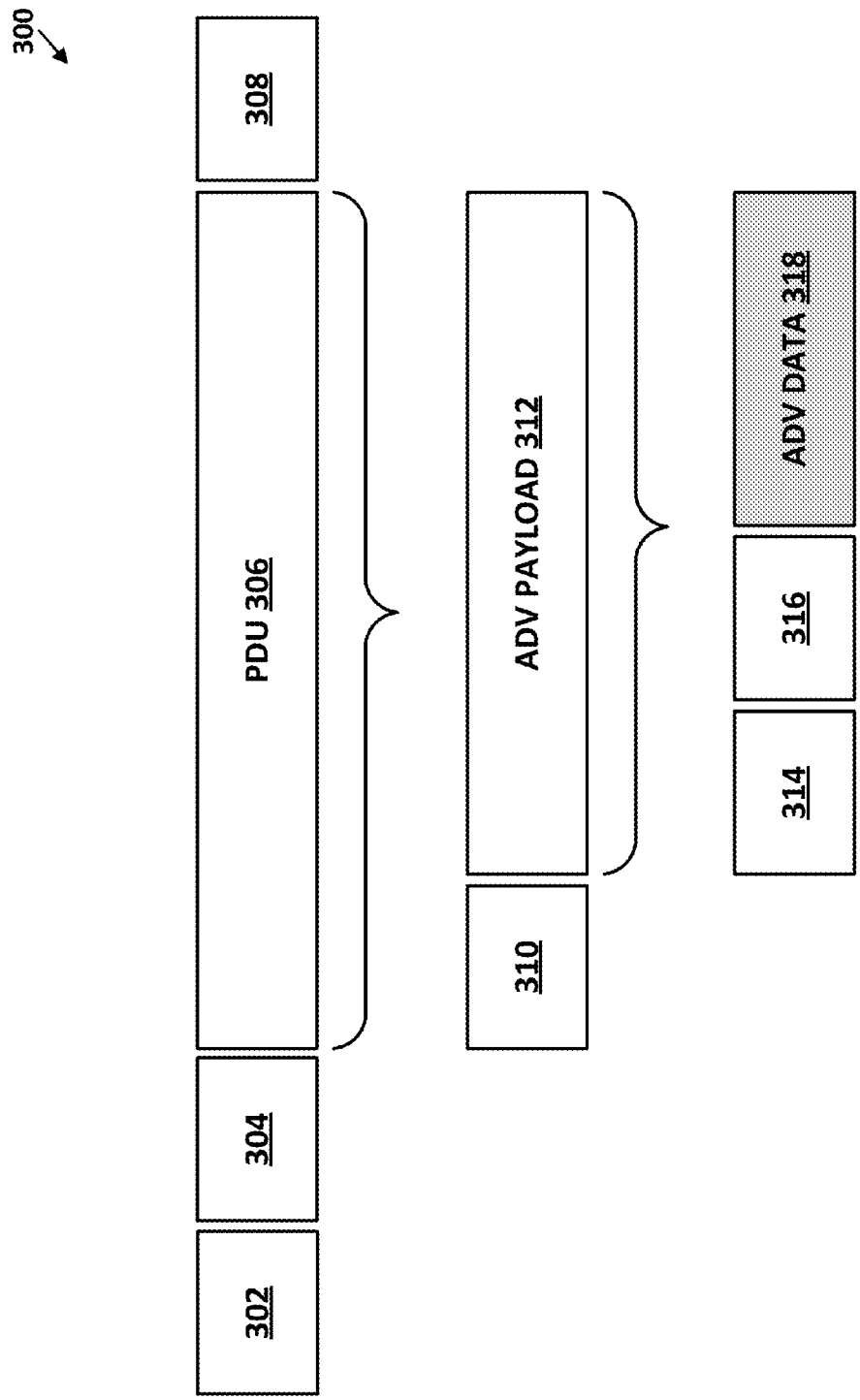
FIG. 3 illustrates an advertisement packet, in accordance with an example embodiment.

FIG. 3 illustrates an example advertising packet. In particular, an advertising packet 300 may, for example, take the form of any advertising packets described above in relation to the FIG. 1. In some additional embodiments, a Bluetooth tag may communicate the advertisement packet 300. As shown in FIG. 3, advertising packet 300 may include preamble 302, access address 304, payload data unit (PDU) 306 with 2 to 39 bytes, and cyclic redundancy check (CRC) 308.

In addition, PDU 306 may include header 310 and advertisement payload 312 with 6 to 37 bytes. Further, advertisement payload 312 may include header 314, MAC address 316, and advertisement data 318 with up to 31 bytes. In an example, the 31 byte space may contain sensor data that may be communicated via the advertisement packet. The header 314 may include a type of the PDU 306. The type of PDU 306 may specify the type of the advertisement packet. As explained above, the advertisement packet type may be a non-connectable, non-scannable, and undirected packet type.

Returning to FIG. 2, the oscillator 204 may generate an RF carrier signal that may carry the data signal generated by the BLE packetizer 202. The RF signal carrying the data may then be broadcasted by the BLE device 200. As illustrated in FIG. 2, the oscillator 204 may be a free-running oscillator, which may be used to directly generate an RF carrier signal. Thus, a free-running oscillator is an alternative to using a frequency synthesizer (i.e. Phase Locked Loop (PLL) synthesizer) to generate an RF carrier signal. Typically, a frequency synthesizer, which also includes a frequency reference circuit, may dissipate a significant portion of a transmitter's power. Accordingly, using a free-running oscillator may result in considerable power savings, which may be advantageous for low power devices.

Further, both the turn-on time for the frequency synthesizer to lock to its frequency reference and the turn-on time of its frequency reference circuit may be significant compared to the packet duration. Therefore, the turn-on time (i.e. time to go from sleep mode to active transmit mode) for a transmitter using a frequency synthesizer may be greater than a transmitter using a free-running oscillator. A longer turn-on time may result may result in greater power dissipation. Accordingly, using the free-running oscillator, which may have a reduced turn-on time compared to a frequency synthesizer, may result in further power savings.

The free-running oscillator may directly generate the RF carrier signal, which may have a frequency within a wireless spectrum, e.g., the 2.4 GHz wireless spectrum. Within examples, the free-running oscillator may directly generate a RF carrier signal that has a frequency of one of the three channels in the 2.48 GHz band that are allocated to BLE advertising protocols according to Bluetooth specifications. The three channels are specified as 1 MHz wide channels with frequencies of 2.402 GHz, 2.480 GHz, and 2.426 GHz.

Note that the example oscillator provided in FIG. 2 and the accompanying description herein is for illustrative purposes only and should not be considered limiting. For instance, the BLE device 200 may include more than one free-running oscillator. In an example, the BLE device 200 may include three free-running oscillators, each of which may be used to generate a carrier signal at a frequency of the three BLE channels. In such examples, the BLE device 200 may utilize methods such as multichannel transmission and frequency hopping.

Within examples, the free-running oscillator 204 may be a Pierce oscillator, which is illustrated in FIG. 2. The Pierce oscillator 204 may include a transistor 212, a biasing resistor 214, capacitors 216 and 218, and a resonator 220. The resonator 220, which may be located off of the IC of the BLE device 200, may be used as a filter to filter the oscillation frequency. Further, the total capacitance of the two capacitors 216 and 218, as seen by the resonator, may be referred to as the "load capacitance". The load capacitance may affect how far the oscillator loop is resonating, relative to the desired resonant frequency. Accordingly, selectively choosing the resonator, which may have a specific load capacitance requirement, may determine the oscillation frequency.

Within examples, the resonator 220 may be a thin-film bulk acoustic resonator (FBAR). An FBAR resonator 220 may include a piezoelectric thin film between two metal layers. FBAR are high-Q resonators that may have a stable and a low phase-noise center frequency, which may be the oscillation frequency. Within examples, FBAR resonators may have a Q of several hundred. In other examples, FBAR resonators may have an (unloaded) Q of over one thousand. Further, temperature compensation may be used to maintain the center frequency of the FBAR resonator 220 at the frequency of the wireless channel.

Note that the example resonator provided in FIG. 2 and the accompanying description herein is for illustrative purposes only and should not be considered limiting. For instance, the resonator may be any resonator that may be high frequency resonator, which may provide an oscillation frequency with a stability and an accuracy that may meet Bluetooth standards. In other examples, the resonator may be a crystal resonator. In an example, the resonator may be a quartz resonator.

As noted above, the RF carrier signal generated by the oscillator 204 may be used to carry the data signal generated by the BLE packetizer 202. More specifically, the data signal generated by the BLE packetizer 202 may act as a tuning code, which may have a specific symbol rate. Further, the tuning code may be used to directly modulate the RF carrier signal. Accordingly, the modulated RF carrier signal may carry the data signal generated by the BLE packetizer 202. Within examples, the tuning code may modulate the RF carrier signal according to at least BLE's protocols.

For instance, BLE protocols specify using Gaussian Frequency Shift Keying (GFSK) as the modulation scheme to modulate the RF carrier signal. Accordingly, the tuning code may be used to modulate the RF carrier signal to two different frequencies of the same advertising channel according to GFSK. Additionally and/or alternatively, the tuning code may be used to modulate the RF carrier signal to two different frequencies of the same advertising channel according to Binary Frequency Shift Keying (BFSK). the tuning The oscillator 204 may include a bank of switched capacitors, represented by variable capacitors 216 and 218 in FIG. 2, which may be used to adjust the load capacitance of the Pierce oscillator 204. As explained above, adjusting the load capacitance of the Pierce oscillator 204 may adjust the oscillation frequency. The digital data signal, indicative of digital "0" and "1", may be used to modify the load capacitance of the Pierce oscillator 204, such that the oscillator 204 may generate a modulated signal of two frequencies, one of which corresponds to digital "0" and the other to digital "1".

Accordingly, the modulated RF signal, carrying the data signal, may be transmitted to a class-D power amplifier 206 as illustrated in FIG. 2. However, also note that at least a portion of the modulated signal may be transmitted to a prescaler 208. The prescaler 208 may scale the signal and provide the scaled signal to the BLE packetizer 202, where it may be used as a clock source. For instance, the prescaler 208 may scale down the 2.48 GHz signal to a 1 Mhz or 8 Mhz signal. By using a portion of the carrier signal as a clock source for the BLE packetizer 202, there may be no need for a separate timing source for the BLE packetizer 202, thereby further increasing power savings.

Furthermore, as illustrated in FIG. 2, the modulated RF carrier signal may be amplified using the class-D power amplifier 206. The amplified signal may then be transmitted to the radio (represented as "RF" in FIG. 2) where it may be broadcast over the air. As explained above, in some embodiments, the BLE device 102 may be operating in advertising mode, which involves the BLE device 102 periodically transmitting advertising packets. Accordingly, the broadcasted RF signal may include advertisement packets, which may be received by one or more Bluetooth devices.

The BLE device 200 may be powered by the powertrain 210. The powertrain may include a low dropout regulator (LDO) 228, a power on reset (PoR) 222, a bandgap voltage reference (Bandgap) 226, and a real time clock (RTC) 224. Note that the RTC 224 may have a low frequency and may operate without a crystal reference, as the BLE packetizer 202 may use a signal from the oscillator 204 as explained above.

Figure 4:
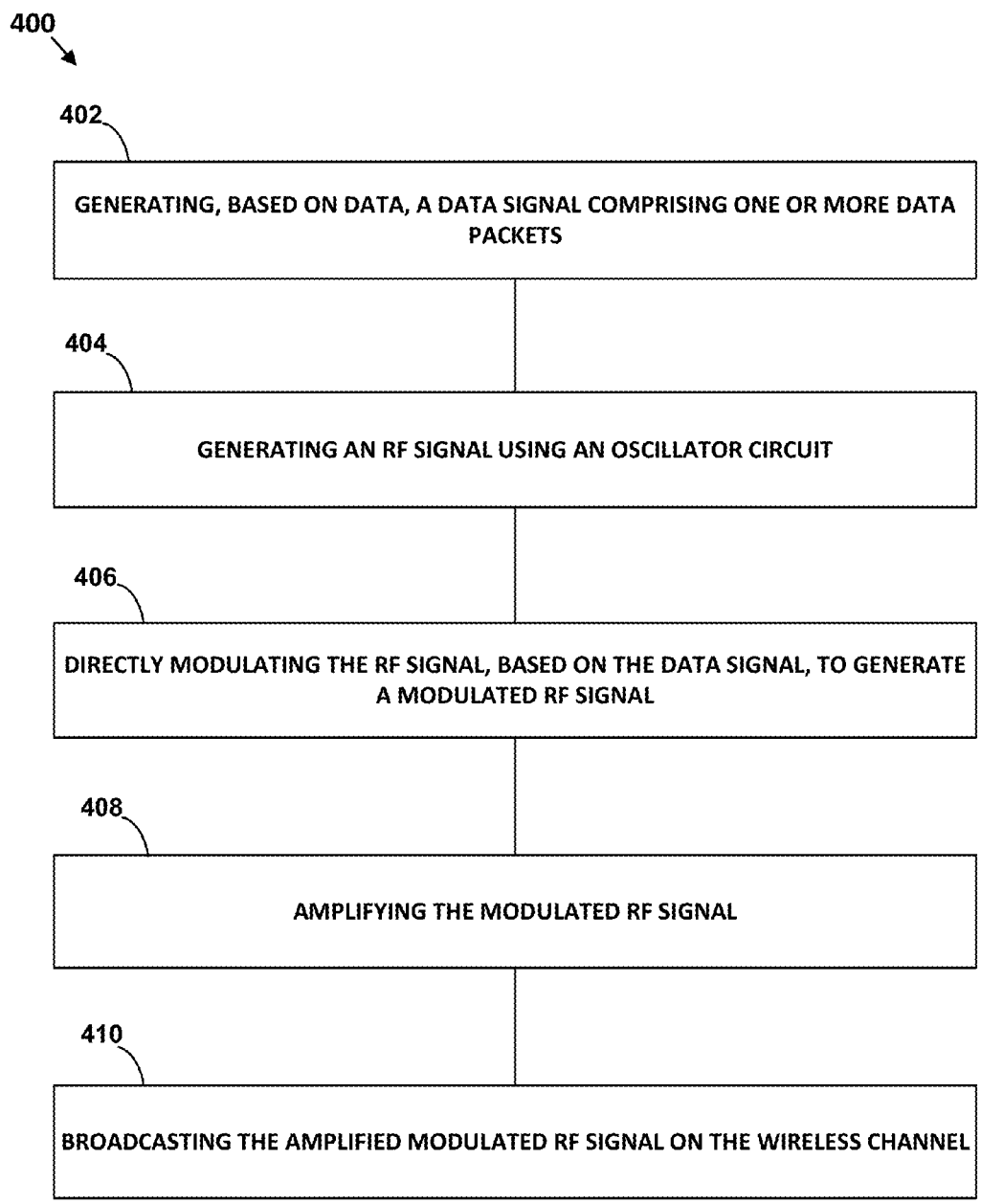
FIG. 4 is a flow diagram of a method, in accordance with an example embodiment.

Accordingly, the BLE device 200 may transmit a signal to or more computing devices by carrying out one or more steps, processes, and/or functions as illustrated by one or more of blocks 402 through 410 of FIG. 4.

FIG. 4 illustrates a flow diagram of an example method for broadcasting an advertisement event on a wireless channel. In particular, method 400 of FIG. 4 may be carried out or implemented by one or more of the Bluetooth devices described above. For example, method 400 may be carried out by the device 102 in FIG. 1 to broadcast an advertisement packet to computing devices 106 and 108. Further, method 400 may include one or more steps, processes, and/or functions as illustrated by one or more of blocks 402 through 410. Although the blocks are illustrated in a sequential order, a number of these blocks may also be performed simultaneously and/or in a different order than those illustrated. Also, the various blocks may be combined into fewer blocks, divided into additional blocks, and/or removed based upon specific implementations.

At block 402, the method 400 includes generating, based on data, a data signal comprising one or more data packets. The data may include information such as encryption parameters, modulation parameters, mode of operation of the device, packet type etc. Further, the data may include the data that may be included in the data packet. Further, the data packet may be a non-connectable, non-scannable advertising packet.

At block 404, the method 400 further includes generating an RF signal using an oscillator circuit. Within examples, the oscillator circuit may be the oscillator circuit described in relation to FIG. 2. Accordingly, a Pierce oscillator, with an FBAR, may directly generate the RF carrier signal. Further, as shown by block 406, the method 400 further includes directly modulating the RF signal, based on the data signal, to generate a modulated RF signal. As noted above, the modulated RF signal may conform to BLE's protocols. Further, the RF signal may be directly modulated by using the data signal to adjust the load capacitance of the Pierce oscillator using a bank of switched capacitors.

At block 408, the method 400 further includes amplifying the modulated RF signal. As noted above, the signal may be amplified using a class-D amplifier. Finally, the method 400 further includes broadcasting the amplified RF signal on the wireless channel. For instance, the wireless channel may be a channel in the 2.4 GHz spectrum.

It should be noted that FIG. 2 may correspond to hardware, chipsets, and/or circuitry that are designed or wired to perform the specific logical functions in method 400. Further, each block in method 400 may represent a module, a segment, or a portion of program code, which includes one or more instructions executable by a processor for implementing specific logical functions or steps in the process. The program code may be stored on any type of computer readable medium, for example, such as a storage device including a disk or hard drive.

Figure 5:
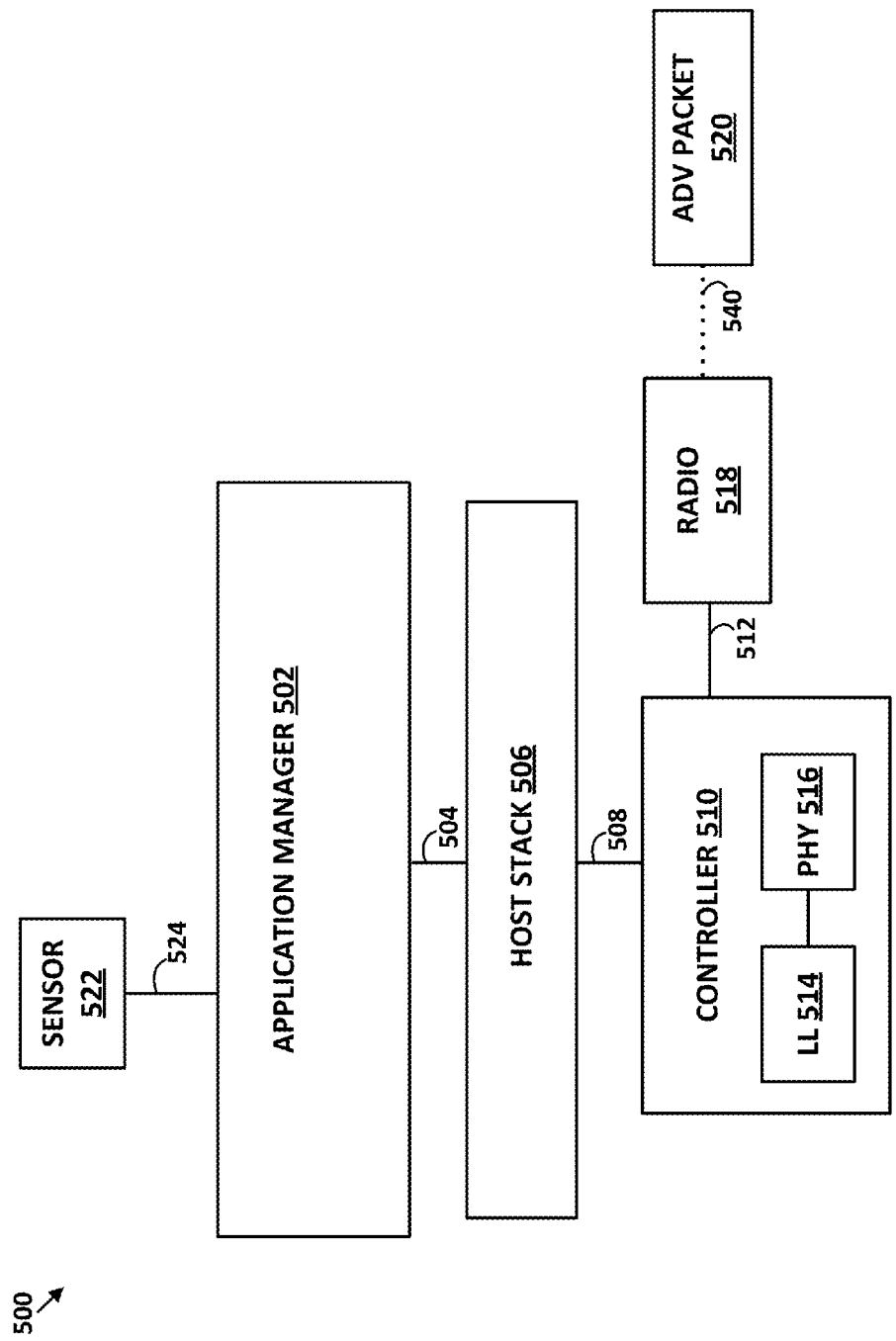
FIG. 5 is a block diagram of a Bluetooth device, in accordance with an example embodiment.

FIG. 5 illustrates a block diagram of an example Bluetooth device. In particular, Bluetooth device 500 may, for example, take the form of any of the computing devices and Bluetooth devices described above in relation to FIGS. 1 and 2. In particular, Bluetooth device 500 may, for example, be combined with any of the computing devices described in the scenarios above. In some instances, Bluetooth device 500 may include the BLE device 200. For example, Bluetooth device 500 may be a sensor, a phone (i.e. computing device), a digital television, a monitor, a tablet computer, wearable computing devices, and/or a human-interface device. Other examples are possible.

As illustrated in FIG. 5, the Bluetooth device 500 may include an application manager 502, a host stack 506, a controller 510, and a radio 514. In particular, the application manager 502 may be coupled to the host stack 506 by a system bus 504 or a similar mechanism. Further, the host stack 506 may be coupled to the controller 510 by a system bus 508 or a similar mechanism. In some embodiments, the interface between the host stack 506 and the controller 510 may be referred to as HCI. Yet further, the controller 510 may be coupled to the radio 518 by a system bus 512 or similar mechanism.

In some examples, the application manager 502, host stack 506, and the controller 510 may be implemented on a single IC chip, which may referred to as a "system-on-chip (SOC)". Accordingly, in a SOC implementation, the three layers may be implemented simultaneously on a low power processor. In other examples, the controller 510 may be implemented on a separate processor than the host stack 506. For instance, the controller 510 may be implemented on a low power processor on a device (i.e. the BLE device 200), while the host stack 506 is implemented on a processor of a host computing device.

As illustrated, the controller 510 may include a link layer 514 (LL) and a physical controller interface 516 (PHY). The link layer 514, which may manage the configuration of the Bluetooth device, may directly interact with the PHY 516, which may include the hardware for generating a signal. The link layer 514, on the other hand, may be implemented using a combination of hardware and software. Accordingly, the PHY 516 and link layer 514 may be implemented in Bluetooth device 500 using the BLE device 200.

Accordingly, in examples where PHY 514 may be implemented using the BLE device 200, the Bluetooth device 500 may operate in an advertising mode. More specifically, the Bluetooth device 500 may broadcast advertising packets on one of BLE's advertising channels. The specific channel onto which the Bluetooth device 500 may be advertised may depend on the BLE device 200. Further, the broadcasted advertising packets may be non-connectable, non-scannable, and undirected advertising packets.

Figure 6:
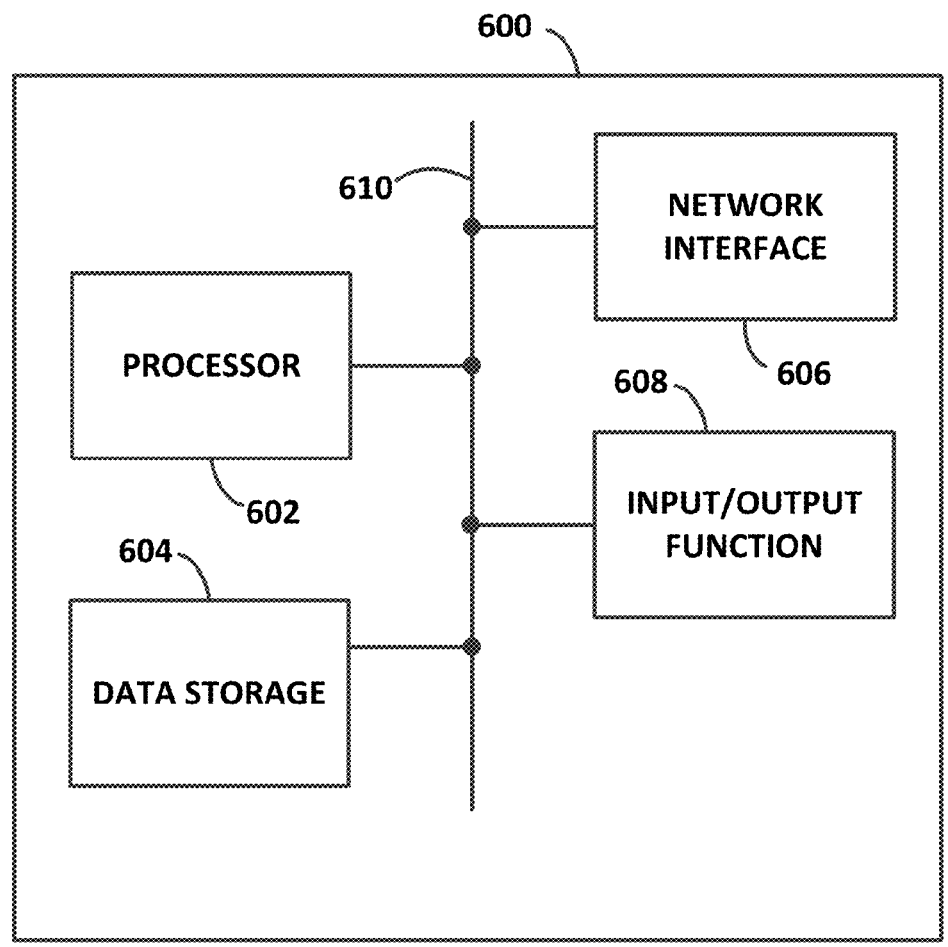
FIG. 6 is a block diagram of a computing device, in accordance with an example embodiment.

In some embodiments, the Bluetooth device 500 may be in advertising mode to broadcast an advertising packet 520 to one or more computing devices. FIG. 6 is a block diagram of an example computing device. In some instances, computing device 600 may, for example, take the form of any computing device described above in relation to FIG. 1 or a similar device that may be configured to perform the methods and functions described herein. In this example, computing device 600 includes a processor 602, data storage 604, a network interface 606, and an input/output function 608, all of which may be coupled by a system bus 610 or a similar mechanism. Processor 602 can include one or more CPUs, such as one or more general purpose processors and/or one or more dedicated processors (e.g., application specific integrated circuits, digital signal processors, network processors, application processing unit, etc.).

Data storage 604, in turn, may comprise volatile and/or non-volatile data storage and can be integrated in whole or in part with processor 602. Data storage 604 can hold program instructions, executable by processor 602, and data that may be manipulated by these instructions to carry out the various methods, processes, or functions described herein. Alternatively, these methods, processes, or functions can be defined by hardware, firmware, and/or any combination of hardware, firmware and software. By way of example, the data in data storage 604 may contain program instructions, perhaps stored on a non-transitory, computer-readable medium, executable by processor 602 to carry out any of the methods, processes, or functions disclosed in this specification or the accompanying drawings.

Network interface 606 may take the form of a wireless connection, such as Bluetooth. In particular, network interface 606 may enable one or more Bluetooth standards or protocols, including BLE protocols and related advertising protocols. For example, referring back to FIG. 1, computing device 106 may also include network 606 to pair with computing device 108. In addition, network interface 606 may take the form of other wireless connections such as IEEE 802.11 (Wi-Fi), or a wide-area wireless connection. However, other forms of physical layer connections and other types of standard or proprietary communication protocols may be used over network interface 606. Furthermore, network interface 606 may comprise multiple physical interfaces. Further, network interface 606 may take the form of a wireline connection, such as an Ethernet connection.

Input/output function 608 may facilitate user interaction with example computing device 600. Input/output function 608 may comprise multiple types of input devices, such as a keyboard, a mouse, a touch screen, and so on. Similarly, input/output function 608 may comprise multiple types of output devices, such as a screen, monitor, printer, or one or more light emitting diodes (LEDs). Additionally or alternatively, example computing device 600 may support remote access from another device, via network interface 606 or via another interface (not shown), such as a universal serial bus (USB) or high-definition multimedia interface (HDMI) port.

In some embodiments, the computing device 600 may include a device platform or operating system (not shown).

In some instances, the device platform or the operating system may be compatible with Bluetooth, Bluetooth Low Energy (BLE) protocols, and/or BLE advertising protocols. In some instances, the device platform or the operating system may be configured as a multi-layered Linux platform or operating system. The device platform may include different applications and an application framework, as well as various kernels, libraries, and runtime entities. In other examples, other formats or systems may operate the computing device 600 as well.

Accordingly, Bluetooth device 500 may transmit advertising packet 520 which may be received by computing device 600. In particular, an application may be downloaded on Bluetooth device 500 or on a computing device combined with Bluetooth device 500. Further, the application may exchange advertisement data with application manager 502 through an application interface. Yet further, the applications may communicate with application manager 502 to transmit the advertisement packet 520 to other devices (not shown in FIG. 5), such as computing device 600.

In some embodiments, Bluetooth device 500 may enter advertisement mode to transmit an advertising packet over the air for one or more applications. In some examples, the application of the Bluetooth device 500 may be predetermined. For instance, the Bluetooth device 500 may be a location beacon. In an example, the Bluetooth beacon 500 may be located in the inside of a building (i.e. an office building, store, etc.). Further, a computing device 600 may be located in proximity to the Bluetooth beacon 500. When the Bluetooth beacon 500 transmits advertising packets, it may transmit the advertising packet with location data. Depending on the specific embodiment, the location data can take many different forms. For example, the Bluetooth beacon 500 may be configured to provide data related to a location of the respective Bluetooth beacon either via relative position information or geographic coordinate system data. In another example, the Bluetooth beacon 500 may provide the computing device 600 with global location data.

These reference advertisement packets may correspond to a location that is known by the computing device 600, such as the entrance to a building. In other embodiments, the computing device 600 may receive data wirelessly including a set of reference advertisement packets. For example, when entering a building, the Bluetooth beacon 500 may communicate a set of data that relate to reference advertisement packets that the computing device 600 can expect to receive when stepping foot inside the store.

In another example, the Bluetooth device 500 may include a sensor 522. As illustrated, the sensor 522 may exchange data with the application manager 502 through the application interface 524. For instance, the Bluetooth device 500 may broadcast advertising packets, which may include data collected by the sensor 522, which the application manager 502 may receive through the application interface 524. For instance, the Bluetooth device 500 may be body-mountable device configured to be mounted to a skin surface (e.g., to skin of the upper arm or abdomen of a person), with one or more sensors for quantitatively and qualitatively testing an analyte concentration in interstitial fluid (e.g., glucose in interstitial fluid) in situ and in real-time. Those of skill in the art will recognize that the sensing platform described herein may be provided in devices that could be mounted on a variety of portions of the human body to measure concentrations of an analyte in other fluids than interstitial fluid (e.g., to measure an analyte in a tear fluid, blood, saliva, or some other fluid or tissue of the body). Accordingly, the Bluetooth device 500 may be used for chronic medical monitoring. Further, the Bluetooth device 500 may broadcast, using the BLE device 200, sensor readings to a user's computing device 600.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

The invention claimed is:

1. A method of broadcasting an advertisement event on a wireless channel, the method comprising:
   an oscillator circuit generating an RF signal;
   a prescaler generating a clock signal based on the RF signal;
   a Bluetooth Low Energy (BLE) packetizer using the clock signal to generate a data signal comprising one or more data packets, wherein each of the one or more data packets is a non-connectable data packet;
   directly modulating the RF signal, based on the data signal, to generate a modulated RF signal;
   amplifying the modulated RF signal;
   broadcasting the amplified modulated RF signal on the wireless channel, wherein the amplified modulated RF signal is associated with the advertisement event.

2. The method of claim 1, wherein the one or more data packets are based on a Bluetooth Low Energy (BLE) protocol.

3. The method of claim 1, wherein the oscillator circuit is a Pierce oscillator circuit.

4. The method of claim 1, wherein the wherein the oscillator circuit comprises a thin-film bulk acoustic resonator (FBAR).

5. The method of claim 1, wherein a frequency of the wireless channel is one or more of the following frequencies: 2.402, 2.426, and 2.48 GHz.

6. The method of claim 1, wherein the modulated RF signal comprises a first frequency and a second frequency, wherein the first frequency and the second frequency are within a bandwidth of the wireless channel.

7. The method of claim 6, wherein directly modulating the RF signal comprises modulating the RF signal using Gaussian Frequency Shift Keying (GFSK).

8. The method of claim 1, wherein directly modulating the RF signal, based on the data signal, to generate the modulated RF signal comprises using the data signal to control a capacitor bank coupled to the oscillating circuit.

9. The method of claim 1, wherein the advertisement event is broadcasted periodically.

10. The method of claim 1, wherein the clock signal is a scaled version of the RF signal.

11. The method of claim 1, wherein the clock signal is a scaled version of the modulated RF signal.

12. A broadcasting unit comprising:
   an oscillator configured to generate an RF signal;
   a prescaler configured to generate a clock signal based on the RF signal;
   a Bluetooth Low Energy (BLE) packetizer configured to use the clock signal to generate a data signal comprising one or more data packets, wherein each of the one or more data packets is a non-connectable data packet, and wherein the RF signal is directly modulated based on the data signal to generate a modulated RF signal;
   a power amplifier configured to amplify the modulated RF signal; and
   an antenna configured to broadcast the amplified modulated RF signal in a wireless channel as an advertisement event.

13. The broadcasting device of claim 12, wherein the oscillator circuit comprises a thin-film bulk acoustic resonator (FBAR).

14. The broadcasting device of claim 12, wherein the one or more data packets are based on a Bluetooth Low Energy (BLE) protocol.

15. The broadcasting device of claim 12, wherein the oscillator circuit is a Pierce oscillator circuit.

16. The broadcasting device of claim 12, wherein the modulated RF signal comprises a first frequency and a second frequency, wherein the first frequency and the second frequency are within a bandwidth of a wireless channel.

17. A system comprising:
   one or more processors;
   an oscillator, comprising an FBAR resonator, configured to generate an RF signal;
   a prescaler generating a clock signal based on the RF signal;
   a Bluetooth Low Energy (BLE) packetizer configured to:
      receive data from the one or more processors;
      use the clock signal to generate a data signal comprising one or more data packets, wherein each of the one or more data packets is a non-connectable data packet wherein the RF signal is directly modulated based on the data signal to generate a modulated RF signal;
   a power amplifier configured to amplify the modulated RF signal; and
   an antenna configured to broadcast the amplified modulated RF signal in a wireless channel as an advertisement event.

18. The system of claim 17 further comprising a sensor, wherein the data is based on an output of the sensor.

19. The system of claim 17, wherein the one or more data packets are based on a BLE protocol.

* * * * *